United States Patent
Park et al.

(10) Patent No.: US 6,261,890 B1
(45) Date of Patent: Jul. 17, 2001

(54) SEMICONDUCTOR DEVICE HAVING CAPACITOR AND METHOD OF MANUFACTURING THE SAME

(75) Inventors: Byung-lyul Park; Myoung-bum Lee; Hyeon-deok Lee, all of Seoul (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/209,651

(22) Filed: Dec. 10, 1998

(30) Foreign Application Priority Data

Dec. 11, 1997 (KR) .................................. 97-67745

(51) Int. Cl.⁷ .................................. H01L 21/8234

(52) U.S. Cl. .................. 438/238; 438/254; 438/397; 438/398; 438/648; 438/650

(58) Field of Search ................................ 438/238, 254, 438/397, 648, 650, 398

(56) References Cited

U.S. PATENT DOCUMENTS

| | | | | |
|---|---|---|---|---|
| 5,356,826 | * | 10/1994 | Natsume | 437/60 |
| 5,510,289 | * | 4/1996 | Choi | 437/60 |
| 5,849,618 | * | 12/1998 | Jeon | 438/254 |
| 5,861,332 | * | 1/1999 | Yu et al. | 438/240 |
| 5,970,309 | * | 10/1999 | Ha et al. | 438/3 |

* cited by examiner

*Primary Examiner*—Richard Elms
*Assistant Examiner*—Pho Luu
(74) *Attorney, Agent, or Firm*—Marger Johnson & McCollom, P.C.

(57) ABSTRACT

The capacitor of semiconductor devices includes a first electrode, a dielectric layer formed of a metal oxide layer including a $Ta_2O_5$ layer, and a second electrode composed of first and second metal nitride layers sequentially stacked. First and second metal nitride layers are a TiN layer and a WN layer. The second electrode of the capacitor is a double-layered structure having the first and second metal nitride layers, and thus annealing after forming the second electrode is performed at 750° C. or less to avoid increasing an equivalent oxide thickness of the dielectric layer.

8 Claims, 2 Drawing Sheets

SEMICONDUCTOR DEVICE HAVING CAPACITOR AND METHOD OF MANUFACTURING THE SAME

BACKGROUND OF THE INVENTION

1. Field of the Invention

The present invention relates to a semiconductor device and a method of manufacturing the same, and more particularly, to a semiconductor device including a capacitor, and to a method of manufacturing the same.

2. Description of the Related Art

As the integration of a semiconductor device increases, cell area has decreased and also the area available for capacitors has decreased. Thus, a method for increasing cell capacitance must be developed to manufacture a high-integrated semiconductor device.

For devices having a capacitor, e.g., a DRAM (dynamic random access memory), one way to increase cell capacitance in a smaller area is to use a dielectric layer formed with a high dielectric constant material, e.g., tantalum oxide ($Ta_2O_5$) instead of silicon nitride or silicon oxide. A capacitor employing a tantalum oxide layer as the dielectric layer includes a first electrode and a second electrode formed of polysilicon on the dielectric layer. However, in a structure in which the $Ta_2O_5$ layer contacts the polysilicon layer, silicon from the polysilicon layer reacts with oxygen from the tantalum oxide layer to form a silicon oxide layer on an interface between these two layers. Thus, an overall equivalent thickness to $SiO_2$, i.e., a thickness of an effective oxide layer increases, thereby lowering capacitance, and oxygen in the tantalum oxide layer is deficient, thereby increasing leakage current.

One approach that has been used in an attempt to overcome this problem is forming the second electrode on the dielectric layer of a high dielectric constant using a single metal layer of WN or TiN.

When the second electrode is a single layer of WN, however, step coverage of the WN layer is poor. It is difficult to use the WN layer for a high-integrated semiconductor device.

When the second electrode is a single layer of TiN, a predetermined thin thickness, e.g., approximately 100 Å, is required to avoid increasing the leakage current density. When the TiN layer is approximately 100 Å, a polysilicon layer must be further formed on the TiN layer to be used as an interconnection layer. When the polysilicon layer is formed on the TiN layer, annealing after forming the polysilicon layer must be performed at 750° C. or higher, e.g., 850° C. Thus, the equivalent oxide thickness of the dielectric layer increases. Further, an annealing temperature of 750° C. or higher is not desirable for high-integrated semiconductor devices.

SUMMARY OF THE INVENTION

It is therefore an object of the present invention to provide a semiconductor device having an improved capacitor structure to overcome above mentioned problems.

It is a further object of the present invention to provide a method of manufacturing the semiconductor device with an improved structure of dielectric and conductive layers in capacitors.

In accordance with the present invention, the capacitor of semiconductor devices includes a first electrode, a dielectric layer composed of a metal oxide layer including a $Ta_2O_5$ layer, and a second electrode composed of first and second metal nitride layers sequentially stacked. In the preferred embodiment, the first and second metal nitride layers are a TiN layer and a WN layer, respectively, sequentially stacked on a dielectric layer.

To achieve the further object of the present invention, there is provided a method of manufacturing a semiconductor device including a capacitor. In this method, a first electrode of a capacitor is formed on a semiconductor substrate, and a dielectric layer having a metal oxide layer on the first electrode is formed. Then, first and second metal nitride layers are sequentially formed on the dielectric layer to form a second electrode of a capacitor composed of the first and second metal nitride layers. The first and second metal nitride layers are preferably a TiN layer and a WN layer.

According to the present invention, the second electrode of the capacitor is a double layered structure including first and second metal nitride layers so that annealing after forming the second electrode is performed at 750° C. or less to avoid increasing an equivalent oxide thickness of the dielectric layer.

BRIEF DESCRIPTION OF THE DRAWINGS

The above objects, advantages and features of the present invention will become more apparent by describing in detail a preferred embodiment thereof with reference to the attached drawings in which.

DESCRIPTION OF THE PREFERRED EMBODIMENT

Figure 1:
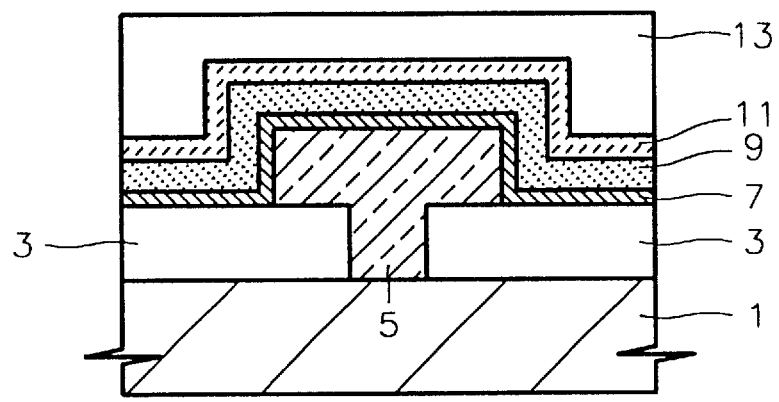
FIG. 1 is a cross-sectional view of a semiconductor device including a capacitor according to the present invention.

Referring to FIG. 1, a semiconductor device includes a first electrode 5 of a capacitor. The first electrode 5 is formed of an impurity-doped polysilicon layer and connected to a semiconductor substrate 1 through a first interlevel dielectric layer 3 having a contact hole. A dielectric layer 7 including a metal oxide layer, preferably, a tantalum oxide ($Ta_2O_5$) layer, is formed on the first electrode 5. First and second metal nitride layers 9 and 11 are sequentially formed on the dielectric layer 7 to form a second electrode of the capacitor.

The second electrode is composed of double layers which do not react with the material of the dielectric layer 7 to make the dielectric layer thicker. The first and second metal nitride layers are formed of a TiN layer 9 and a WN layer 11, respectively stacked sequentially on the dielectric layer 7. A second interlevel dielectric layer 13 is formed on the second electrode of the capacitor.

FIGS. 2 through 5 are cross-sectional views illustrating a method of manufacturing a semiconductor device including a capacitor according to the present invention.

Figure 2:
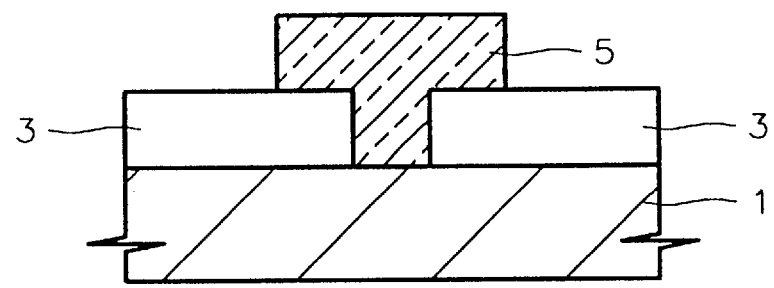
FIGS. 2 through 5 are cross-sectional views for illustrating a method of manufacturing a semiconductor device including a capacitor according to the present invention.

FIG. 2 shows the step of forming a first interlevel dielectric layer 3 and a first electrode 5 of a capacitor. An insulating layer, e.g., silicon oxide or silicon nitride, is formed on a semiconductor silicon substrate 1 and patterned to form a first interlevel dielectric layer 3 having a contact hole exposing the semiconductor substrate 1. Subsequently, a conductive layer, e.g., a polysilicon layer doped with an impurity, is formed to fill the contact hole, thereby contacting substrate 1, and patterned to form the first electrode 5 of the capacitor. Here, the impurity used to dope the polysilicon is arsenic (As) or phosphorus(P).

Figure 3:
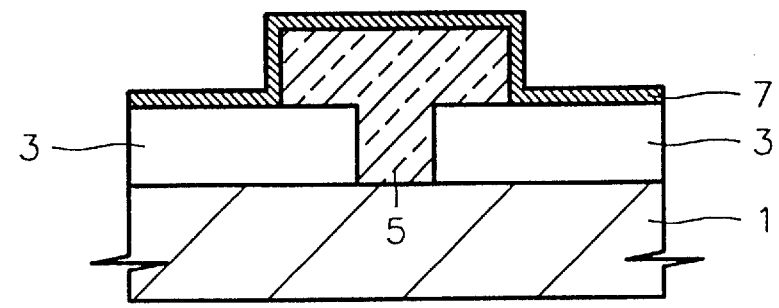

FIG. 3 shows the step of forming a dielectric layer 7. The dielectric layer 7 having a high dielectric constant, e.g., a $Ta_2O_5$ layer is formed on the entire surface of the semiconductor substrate 1 with a thickness of 30–200 Å. Thus, the dielectric layer 7 is formed around the first electrode 5 of the capacitor and on the first interlevel dielectric layer 3.

Figure 4:
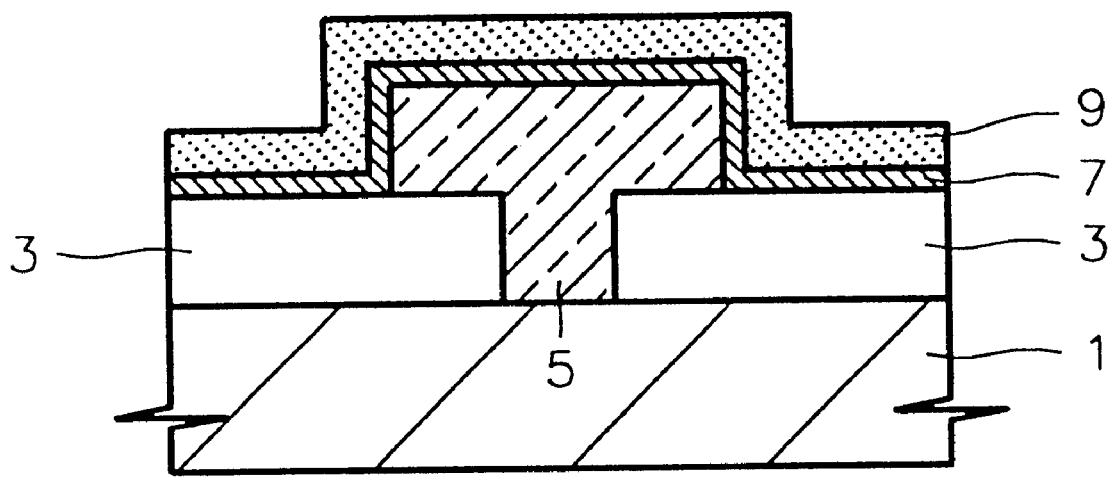

FIG. 4 shows the step of forming a first metal nitride layer 9. The first metal nitride layer 9 is formed on the dielectric layer 7. Here, the first metal nitride layer 9 employing a TiN layer is formed at 600–700° C. with a thickness of 10–1000 Å using a chemical vapor deposition (CVD) method. Here, the first metal nitride layer 9 is formed using a chemical vapor deposition (CVD) method to provide uniform step coverage. The thickness of the TiN layer used for the first metal nitride layer 9 can be variously formed by the second metal nitride layer to be formed. That is, the thickness of the TiN layer can be higher or lower compared to 100 Å thickness used in the prior art.

Figure 5:
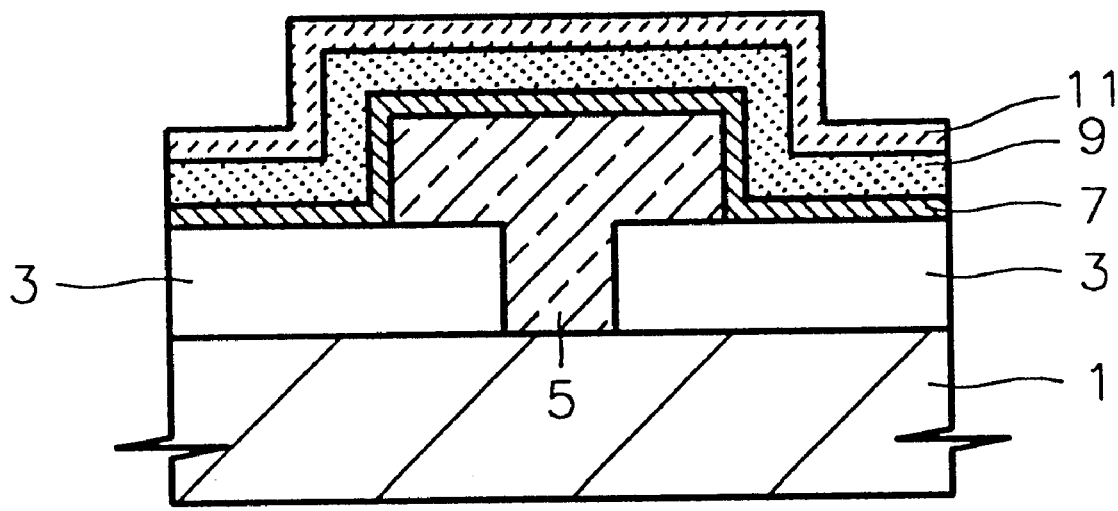

FIG. 5 shows the step of forming a second metal nitride layer 11. The second metal nitride layer 11 is formed on the first metal nitride layer 9 by the CVD method, particularly a plasma enhanced CVD (PECVD) method. Here, the second metal nitride layer is formed of a WN layer, deposited at 300° C. –400° C. to a thickness in the range of 100–1000 Å. When the second metal nitride layer 11 is formed by the CVD method, formation temperature is low and the step coverage is good.

The first and second metal nitride layers 9 and 11 as double layers become a second electrode of the capacitor. When the second electrode of the capacitor is double-layered, i.e., having a TiN layer and a WN layer, annealing after forming the WN layer can be performed at 750° C. or less since a polysilicon layer is not formed on a TiN layer. Thus, an equivalent oxide thickness of a dielectric layer 7 is not increased by reaction of the second electrode material with the dielectric material. Therefore, the capacitance is maximized by the thinness of the dielectric layer, which is not increased by reactions in subsequent process steps. This method is advantageous to making a high-integrated semiconductor device at a lower temperature.

It should be understood that the invention is not limited to the illustrated embodiment and that many changes and modifications can be made within the scope of the invention by a person skilled in the art.

What is claimed is:

1. A semiconductor device having a capacitor, comprising:
   a first electrode;
   a dielectric layer having a metal oxide layer, formed on the first electrode; and
   a second electrode comprising a double-layer structure having first and second metal nitride layers sequentially stacked on the dielectric layer.

2. The semiconductor device of claim 1, wherein the first and second metal nitride layers are formed of a TiN layer and a WN layer.

3. The semiconductor device of claim 2, wherein the TiN layer has a thickness in the range of 10–1000 Å and the WN layer has a thickness in the range of 100–1000 Å.

4. The semiconductor device of claim 2, wherein the TiN layer is formed at 600–700° C. and the WN layer is formed at 300–400° C.

5. The semiconductor device of claim 1, wherein the metal oxide layer is a tantalum oxide ($Ta_2O_5$) layer.

6. The semiconductor device of claim 5, wherein the $Ta_2O_5$ layer is formed on the entire surface of the semiconductor substrate with a thickness of 30–200 Å.

7. The semiconductor device of claim 1, wherein the first and second metal nitride layers are formed of a TiN layer and a WN layer, and wherein the metal oxide layer is a tantalum oxide ($Ta_2O_5$) layer.

8. A semiconductor device having a capacitor, comprising:
   a first electrode;
   a dielectric layer having a metal oxide layer, formed on the first electrode; and
   a second electrode comprising a double-layer structure having first and second metal nitride layers sequentially stacked on the dielectric layer, wherein the first and second metal nitride layers are formed of a TiN layer and a WN layer, wherein the metal oxide layer is a tantalum oxide ($Ta_2O_5$) layer, and wherein annealing is performed at 750° C. or less.

* * * * *